(12) United States Patent
Pitio

(10) Patent No.: US 6,593,863 B2
(45) Date of Patent: Jul. 15, 2003

(54) SERIALIZER

(75) Inventor: Walter Michael Pitio, Morganville, NJ (US)

(73) Assignee: Parama Networks, Inc., San Jose, CA (US)

( * ) Notice: Subject to any disclaimer, the term of this patent is extended or adjusted under 35 U.S.C. 154(b) by 62 days.

(21) Appl. No.: 10/011,938

(22) Filed: Dec. 5, 2001

(65) Prior Publication Data

US 2003/0102992 A1 Jun. 5, 2003

(51) Int. Cl.$^7$ .............................................. H03M 9/00
(52) U.S. Cl. ................... 341/101; 341/100; 341/61; 341/107; 341/87; 375/354; 375/350
(58) Field of Search .......................... 341/101, 61, 67, 341/87, 107; 702/119; 710/1; 714/798; 375/354, 350

(56) References Cited

U.S. PATENT DOCUMENTS

| | | | | |
|---|---|---|---|---|
| 4,218,758 A | * | 8/1980 | Allen et al. | 341/101 |
| 4,885,584 A | * | 12/1989 | Dalrymple | 341/101 |
| 4,901,076 A | * | 2/1990 | Askin et al. | 341/101 |
| 5,490,282 A | * | 2/1996 | Dreps et al. | 341/101 |
| 5,587,709 A | * | 12/1996 | Jeong | 341/100 |
| 6,107,946 A | * | 8/2000 | Jeong | 341/101 |

* cited by examiner

*Primary Examiner*—Michael Tokar
*Assistant Examiner*—Lam Mai
(74) *Attorney, Agent, or Firm*—DeMont & Breyer, LLC

(57) ABSTRACT

A method for serializing bits without introducing glitches (i.e., spurious signals) into the serialized data stream is disclosed. Furthermore, the embodiments of the present invention do not require a timing signal (e.g., a clock signal, etc.) at the frequency of the serialized data stream. On the contrary, the illustrative embodiment of the present invention requires timing signals with a frequency equal to the rate at which words are loaded into the serializer. The illustrative embodiment comprises: a first unanimity gate for generating a first binary waveform based on a first coincidence function of a second binary waveform and a third binary waveform; a second umanimity gate for generating a fourth binary waveform based on a second coincidence function of the first binary waveform and a fifth binary waveform; and a first temporal delay device for receiving the fourth binary waveform and for generating the third binary waveform based on the fourth binary waveform.

24 Claims, 9 Drawing Sheets

SERIALIZER

FIELD OF THE INVENTION

The present invention relates to telecommunications in general, and, more particularly, to an apparatus for converting one or more parallel words into one or more serialized streams of bits.

BACKGROUND OF THE INVENTION

There are situations where parallel words of bits need to be transmitted via a serial communications channel. In these situations, a first apparatus converts the words into a serialized stream of bits for transmission on the serial communications channel. Typically the first apparatus is known as a serializer.

At the receiving end of the serial communications channel, a second apparatus captures the serialized stream of bits and restores it back into parallel words. Typically, the second apparatus is known as a deserializer. Regardless of what the first apparatus and the second apparatus are called, the second apparatus performs the inverse operation of the first apparatus.

FIG. 1 depicts a block diagram of serial communications system 100 in the prior art, which comprises: serializer 101, deserializer 102, timing source 103, timing source 104, and serial communications channel 111, interconnected as shown.

Serializer 101 receives a parallel word of bits and a clock signal (e.g., a clock signal, etc.) from timing source 103 and converts the parallel word into a serialized stream of bits for transmission via serial communications channel 111. For example, serializer 101 can comprise a parallel-load-in/serial-shift-out register that loads words in at a slower rate than it shifts bits out.

Serial communications channel 111 is a logical data structure that can be carried alone or can be multiplexed with other serial communications channels, via a metal wireline, an optical fiber, or a wireless channel (e.g., radio, infrared, etc.).

Deserializer 102 receives the serialized stream of bits from serial communications channel 111 and a clock signal from timing source 104, captures the serialized stream of bits, and converts it back into a parallel word. For example, deserializer 102 can comprise a serial-shift-in/parallel-unload-out shift register.

The design and operation of serializer 101 can be problematic. For example, if two or more of the inputs, including the timing signal, are designed to change synchronously and yet do not, glitches (i.e., spurious signals) can appear at the output of the serializer, which compromises the integrity of the serializer.

Therefore, the need exists for a serializer whose output is free from glitches caused by the synchronous changing of its input signals.

SUMMARY OF THE INVENTION

Some embodiments of the present invention enable the serialization of bits without some of the costs and disadvantages for doing so in the prior art. For example, the illustrative embodiments of the present invention are designed so that only one input to their terminal stage can change at a time, which prevents the introduction of glitches into the serialized data stream.

Furthermore, the illustrative embodiments of the present invention do not require a timing signal (e.g., a clock signal, etc.) at the frequency of the serialized data stream. On the contrary, some of the illustrative embodiments only require a tiring signal with a frequency equal to the rate at which words are loaded into them. And still furthermore, embodiments of the present invention are ideally suited for implementation in integrated circuits because they can run at a rate that is at or near the limits of the technology with which they are fabricated.

The illustrative embodiment comprises: a first unanimity gate for generating a first binary waveform based on a first coincidence function of a second binary waveform and a third binary waveform; a second unanimity gate for generating a fourth binary waveform based on a second coincidence function of the first binary waveform and a fifth binary waveform; and a first temporal delay device for receiving the fourth binary waveform and for generating the third binary waveform based on the fourth binary waveform.

DETAILED DESCRIPTION

Figure 1:
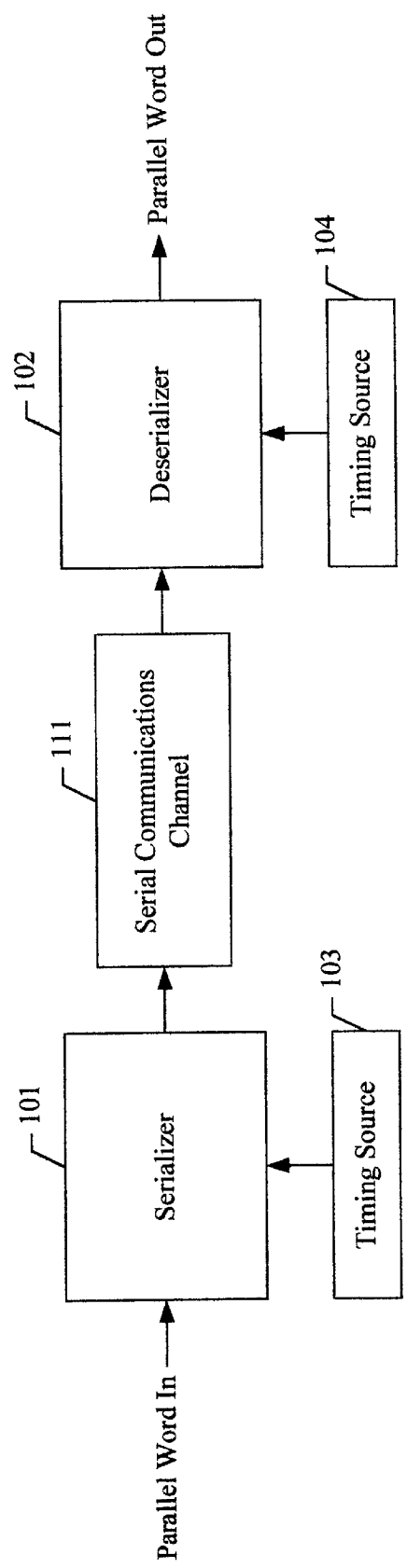
FIG. 1 depicts a block diagram of serial communications system 100 in the prior art.
Figure 2:
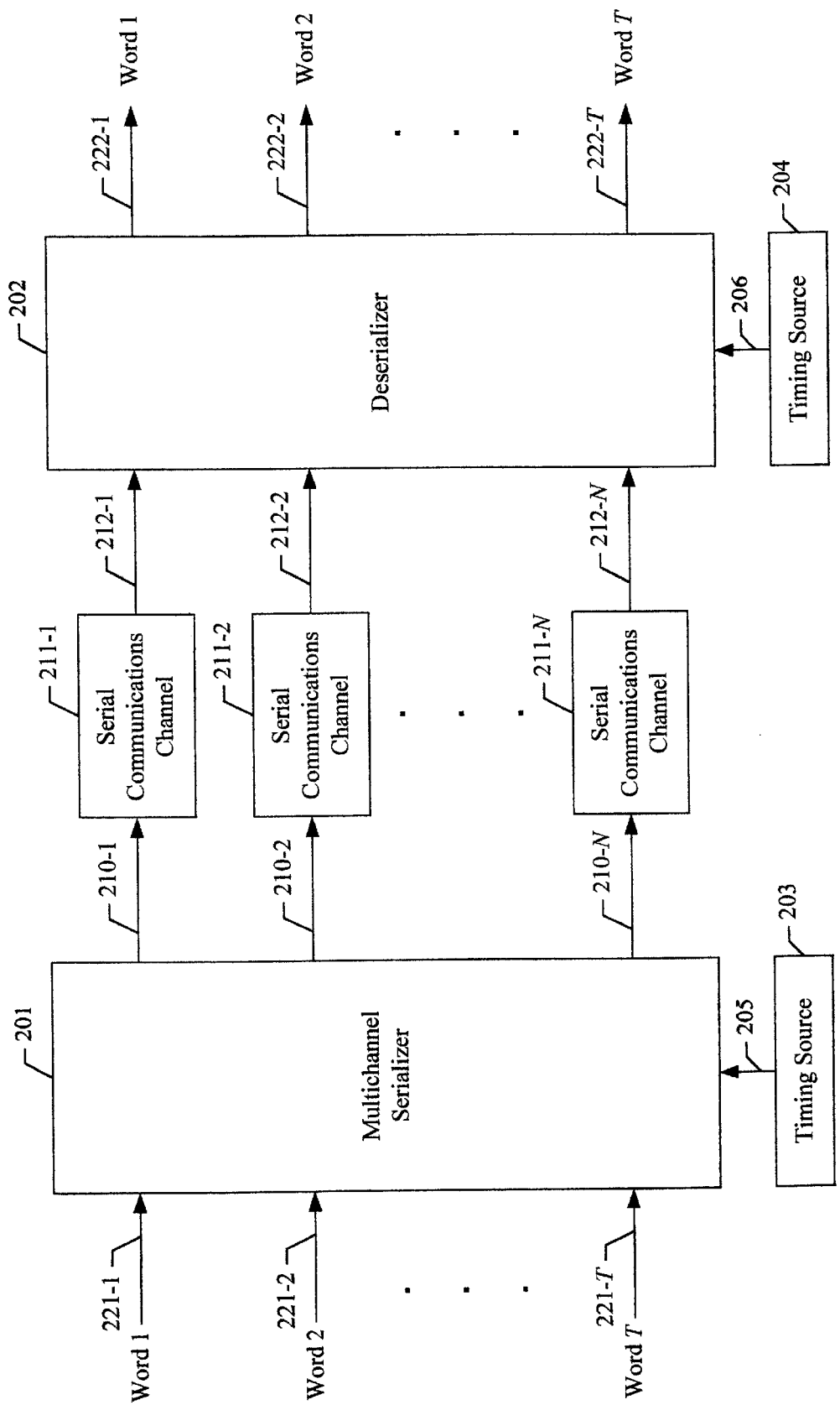
FIG. 2 depicts a block diagram of the first variation of the illustrative embodiment of the present invention.

FIG. 2 depicts a block diagram of the first variation of the illustrative embodiment of the present invention, which comprises: multichannel serializer 201, multichannel deserializer 202, N serial communications channels 211-1 through 211-N, wherein N is a positive integer greater than zero, timing source 203, and timing source 204, all of which are interconnected as shown. In accordance with the first variation of the illustrative embodiment of the present invention, multichannel serializer 201 and multichannel deserializer 202 are each provided with clock signals that are independent of, and asynchronous to, each other.

Figure 3:
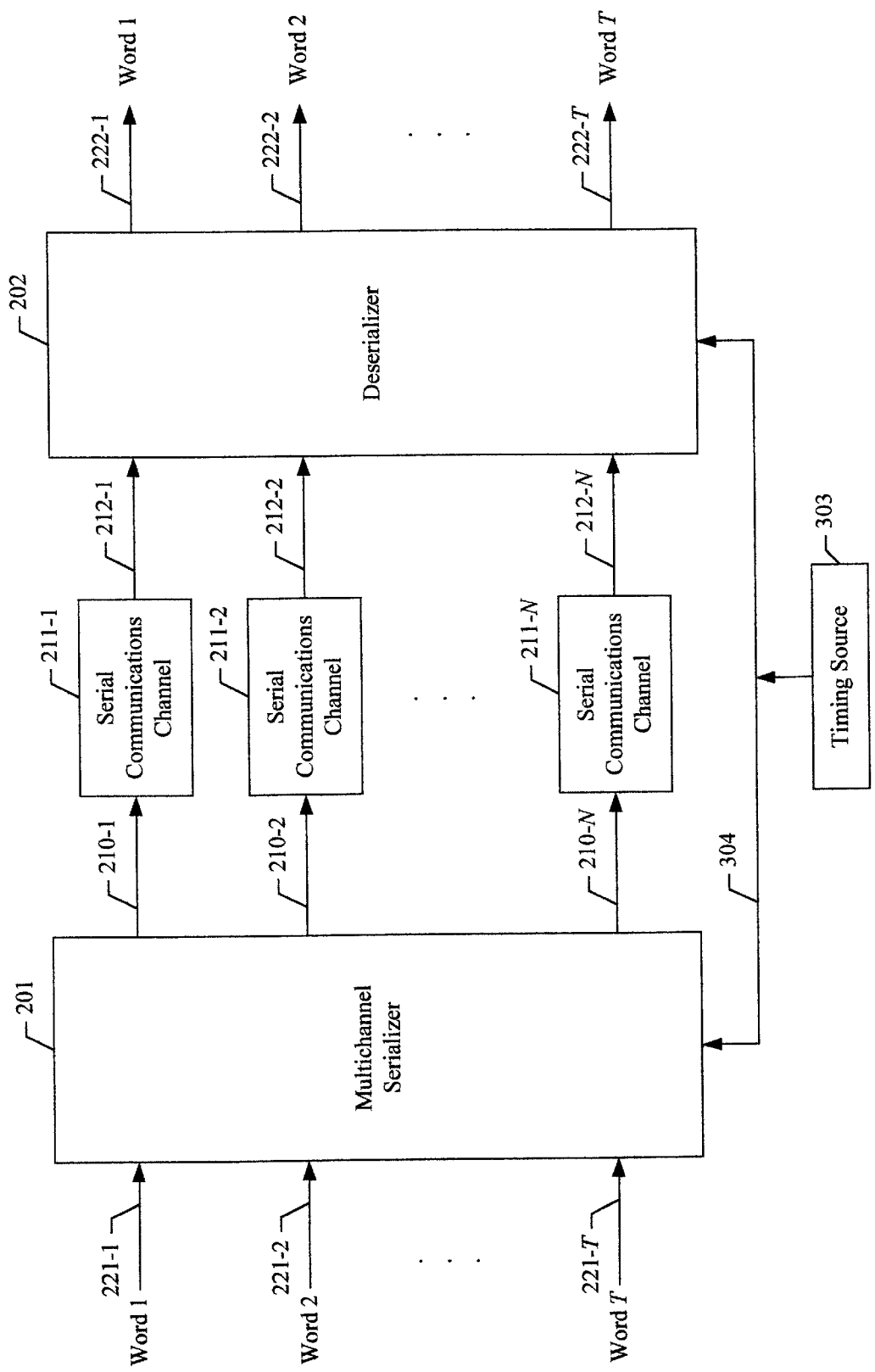
FIG. 3 depicts a block diagram of the second variation of the illustrative embodiment of the present invention.

FIG. 3 depicts a block diagram of the second variation of the illustrative embodiment of the present invention, which comprises: multichannel serializer 201, multichannel deserializer 202, N serial communications channels 211-1 through 211-N, wherein N is a positive integer greater than zero, and timing source 303, all of which are interconnected as shown. In accordance with the second variation of the illustrative embodiment of the present invention, multichannel serializer 201 and multichannel deserializer 202 are each provided with a clock signal from the same timing source.

In all other respects, the two variations of the illustrative embodiment are identical, and, therefore, will be described as one.

In yet another variation of the illustrative embodiment, multichannel deserializer 202 derives the timing signal at which to deserialize the bit stream from one or more of the serialized bit streams themselves. In this variation, the illustrative embodiment can use one or more synchronized oscillators (e.g., phase-locked loops, etc.) to derive the timing signal at which to deserialize the bit stream.

With reference to both FIGS. 2 and 3, there are 64 serial communications channels between multichannel serializer 201 and multichannel deserializer 202 (i.e., N=64). In accordance with the illustrative embodiment, each of serial communications channels 211-1 through 211-N is carried from multichannel serializer 201 to multichannel deserializer 202 via a distinct optical fiber. Furthermore, because each of serial communications channels 211-1 through 211-N is a logical channel, in some alternative embodiments of the present invention two or more of serial communications channels 211-1 through 211-N are multiplexed and transmitted to multichannel deserializer 202 via a single metal wireline, an optical fiber, or a wireless channel (e.g., radio, infrared, etc.). After reading this specification and the accompanying figures, it will be clear to those skilled in the art how to make and use embodiments of the present invention in which N equals a value of other than 64.

Multichannel serializer 201 receives T parallel words, $word_1$ through $word_T$, wherein T is a positive integer greater than zero, on buses 221-1 through 221-T, respectively, and a clock signal from a timing source (e.g., timing source 203, timing source 303, etc.). Multichannel serializer 201 outputs a serialized version of $word_1$ through $word_T$ to serial communications channels 211-1 through 211-N, respectively. In accordance with the illustrative embodiment, T=16. After reading this specification and the accompanying figures, it will be clear to those skilled in the art how to make and use embodiments of the present invention in which T equals a value of other than 16.

In accordance with the illustrative embodiment of the present invention, each of words $word_1$ through $word_t$ comprises W bits, wherein W is a positive integer greater than zero. In accordance with the illustrative embodiment, W=16. After reading this specification and the accompanying figures, it will be clear to those skilled in the art how to make and use embodiments of the present invention in which W equals a value of other than 16. Furthermore, after reading this specification and the accompanying figures, it will be clear to those skilled in the art how to make and use embodiments of the present invention in which some of $word_1$ through $word_T$ comprise a different number of bits than other of $word_1$ through $word_T$ comprise.

When multichannel serializer 201 multiplexes two or more bits from a single word over one serial communications channel, all of the bits from the word that are multiplexed over the same serial communications channel are called a "symbol." In accordance with the illustrative embodiment of the present invention, each word of $word_1$ through $word_T$ comprises M symbols, wherein M is equal to N/T In accordance with the illustrative embodiment, M=N/T=64/16=4. After reading this specification and the accompanying figures, it will be clear to those skilled in the art how to make and use embodiments of the present invention in which M equals a value of other than 4. Furthermore, after reading this specification and the accompanying figures, it will be clear to those skilled in the art how to make and use embodiments of the present invention in which some of words $word_1$ through $word_T$ comprise a different number of symbols than other of words $word_1$ through $word_T$.

In accordance with the illustrative embodiment, there are W/M bits in each symbol before it is encoded with a symbol and/or word synchronization scheme. In accordance with the illustrative embodiment, the number of bits in each symbol equals K=W/M=16/4=4.

In some embodiments of the present invention, the bits in each symbol are encoded with an encoding scheme (e.g., the well-known 8B/10B encoding scheme, etc.) that facilitates symbol and/or word synchronization by multichannel deserializer 202. In all cases, the number of bits transmitted with respect to each symbol is B=K+Z, wherein Z equals the number of bits added to the symbol as part of the symbol and/or word synchronization scheme.

In accordance with the illustrative embodiment, the bits in each symbol are not encoded with an encoding scheme, and, therefore, Z=0 and B=K. In some alternative embodiments of the present invention, multichannel serializer 201 encodes the bits in each symbol with an encoding scheme (e.g., the well-known 8B/10B encoding scheme, etc.) that facilitates symbol and/or word synchronization by multichannel deserializer 202. In these cases, Z=2 and B=K+Z=32/4+2=10. After reading this specification and the accompanying figures, it will be clear to those skilled in the art how to make and use embodiments of the present invention in which some of the symbols comprise a different number of bits than other symbols comprise.

In accordance with the illustrative embodiment, multichannel serializer 201 uses a binary modulation scheme (e.g., binary shift-keying, etc.) and transmits each bit independently over a serial communications channel. In some alternative embodiments of the present invention however, multichannel serializer combines the bits from two or more serial communications channels using a non-binary modulation scheme (e.g., quadriphase-shift keying, etc.) and transmits multiple bits simultaneously over a serial communications channel.

Multichannel serializer 201 outputs N sets of B bits onto each of serial communications channels 211-1 through 211-N for each set of T words received by multichannel serializer 201. The details of multichannel serializer 201 are described below and with respect to FIGS. 4 through 7. Multichannel serializer 201 operates in pipeline-processor fashion, meaning that it continually receives one set of T parallel words after another and transmits N sets of B bits onto each of serial communications channels 211-1 through 211-N for each set of T words received by it.

In accordance with the illustrative embodiment, the propagation delay through each of serial communications channels 211-1 through 211-N need not be the same nor need it remain constant throughout time.

Multichannel deserializer 202 receives a serialized stream of bits from each of serial communications channels 211-1 through 211-N, and a clock signal (e.g., from timing source 204, from timing source 303, etc.), and from them reconstructs and outputs T parallel words, $word_1$ through $word_T$, on buses 222-1 through 222-T. Furthermore, multichannel deserializer 202 operates in pipeline-processor fashion, meaning that it continually outputs one set of T parallel words after another for each of the N sets of B bits it receives from serial communications channels 211-1 through 211-N. U.S. Patent application Ser. No. 09/909,499, filed Jul. 20, 2001, and entitled "Deserializer," which is incorporated by reference, teaches how to make and use a multichannel deserializer such as multichannel deserializer 202.

Timing source 204/303 generates a plurality of differently phased timing signals for multichannel serializer 201. To this end, timing source 204/303 generates B timing signals, $\Phi_0$ through $\Phi_B$, each with the same frequency but 360°/B out of phase with respect to each other. The frequency of each of the timing signals equals the frequency with which words are loaded into multichannel serializer 201.

For example, in accordance with the illustrative embodiment, B=4 and, therefore, timing source 204/303 generates four (4) clock signals as depicted in Table 1.

TABLE 1

Clock signals From Timing Source 204/303 (for B = 4)

| Clock Signal No. | Phase |
|---|---|
| $\Phi_0$ | 0° |
| $\Phi_1$ | 90° |
| $\Phi_2$ | 180° |
| $\Phi_3$ | 270° |

It will be clear to those skilled in the art how to make and use timing source 204/303.

Figure 4:
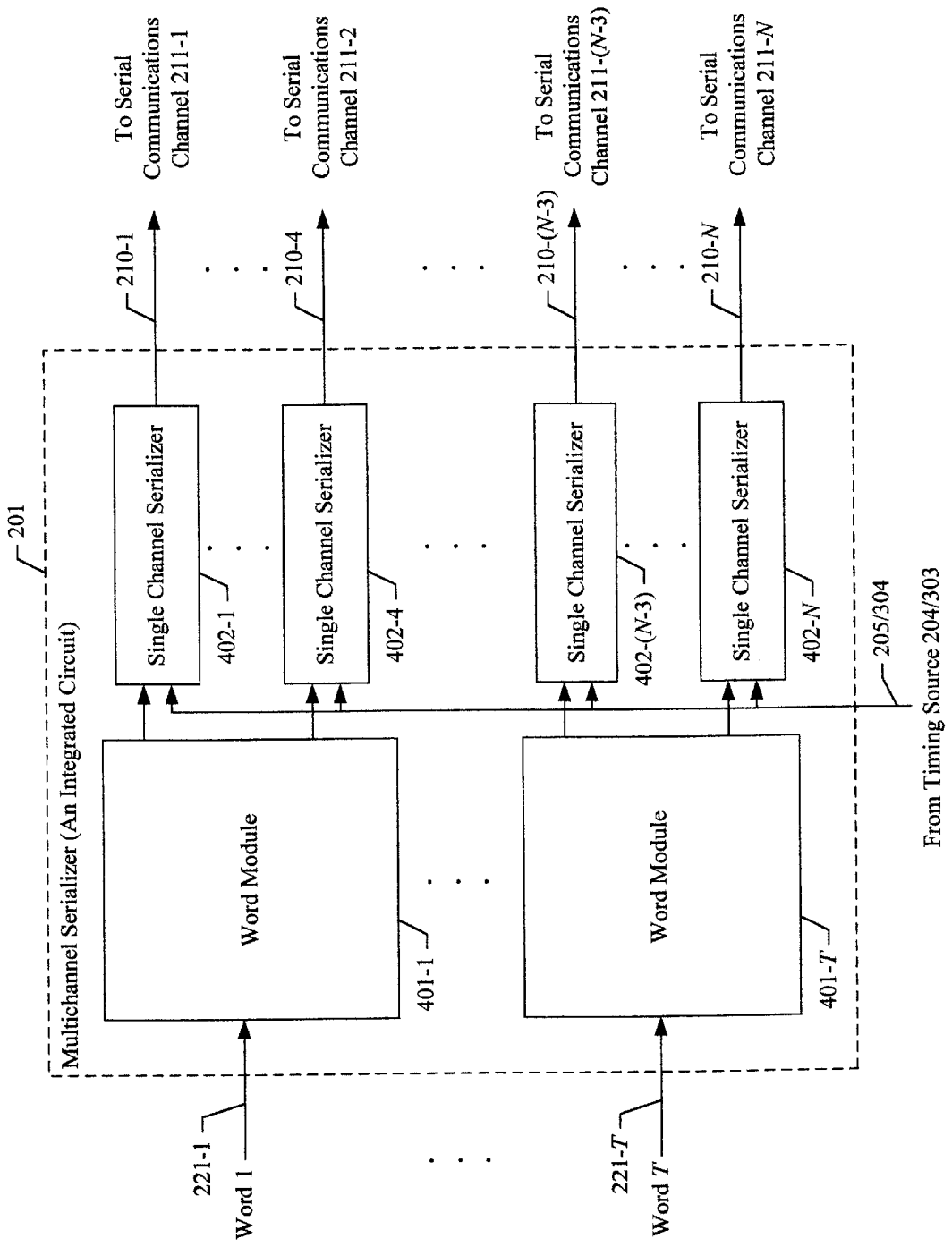
FIG. 4 depicts a block diagram of the salient components of multichannel serializer 201, as depicted in FIGS. 2 and 3.

FIG. 4 depicts a block diagram of the salient components of multichannel serializer 201, which comprises: T word modules 401-1 though 401-T and N single channel serializers 402-1 through 402-N, interconnected as shown.

In accordance with the illustrative embodiment, multichannel serializer 201 is fabricated on an integrated circuit. For the purposes of this specification, the term "integrated circuit" is defined as a slice or chip of material on which is etched or imprinted a complex of electronic components and their interconnections.

Word module 401-p, for p=1 to T, receives a W-bit word from bus 221-p and distributes each of the bits in the word to one of the single channel serializers associated with word module 401-p. In the illustrative embodiment, each word module receives 16 bits and distributes four bits to each of the four single channel serializers associated with the word module. In some alternative embodiments of the present invention, word module 401-p scrambles the bits in each word to increase the number of transitions in the signal on each serial communications channel. Furthermore, in those alternative embodiments in which the bits in each symbol are encoded with an encoding scheme that facilitates symbol and/or word synchronization by multichannel deserializer 202, word module 401-p performs that encoding.

Single channel serializer 402-i, for i=1 to N, receives B bits, $b_0$ through $b_B$, in parallel and B timing signals from timing source 204/303, $\Phi_0$ through $\Phi_B$, and outputs the B bits in serial onto serial communications channel 211-i in little endian order. After reading this specification, it will be clear to those skilled in the art how to make and use alternative embodiments of the present invention in which the bits are output in big endian order.

Figure 5:
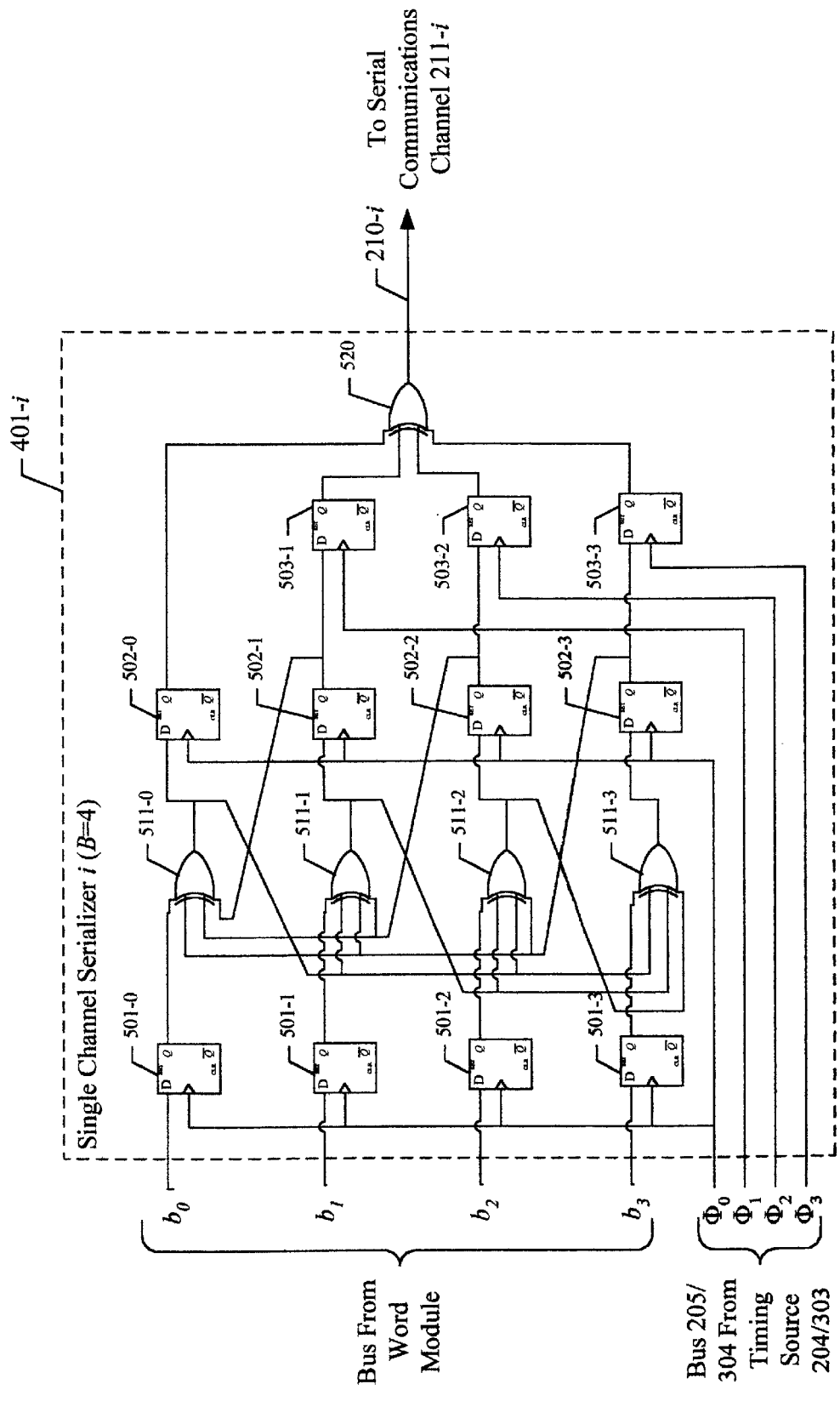
FIG. 5 depicts a block diagram of the salient components of single channel serializer 401-i, as depicted in FIG. 4.

FIG. 5 depicts a block diagram of the salient components of single channel serializer 401-i, which comprises: temporal delay devices 501-0 through 501-3, 502-0 through 502-3, and 503-1 through 503-3, unanimity gates 511-0 through 511-3 and unanimity gate 520, interconnected as shown.

Although the embodiment depicted in FIG. 5 is shown for B=4, it will be clear to those skilled in the art how, after reading this specification, to make and use alternative embodiments of the present invention in which B equals a value other than 4.

In accordance with the illustrative embodiment of the present invention, temporal delay devices 501-0 through 501-3, 502-0 through 502-3, and 503-1 through 503-3 are devices such as identical D-type flip-flops. In some alternative embodiments of the present invention, some or all of the temporal delay devices are another kind of bi-stable storage device, such as a J-K flip-flop, a T-type flop-flop, or a latch. In the alternative embodiment of present invention depicted in FIG. 9 and described below, the temporal delay devices are non-clocked delay devices. In any case, it will be clear to those skilled in the art how to make and use temporal delay devices 501-0 through 501-3, 502-0 through 502-3, and 503-1 through 503-3.

In accordance with the illustrative embodiment of the present invention, unanimity gates 511-0 through 511-3 and unanimity gate 520 each perform an H-input Boolean coincidence function, wherein H is a positive integer greater than one. For the purposes of this specification, a "coincidence function" is defined as a function that is indicative of the modulo 2 sum of the function's arguments.

For the purposes of this specification, a 2-input "coincidence function" is defined as any of the eight Boolean functions depicted in Table 2.

TABLE 2

The 2-Input Coincidence Functions

| $A \oplus B$ | $\overline{A \oplus B}$ |
|---|---|
| $\overline{A} \oplus B$ | $\overline{\overline{A} \oplus B}$ |
| $A \oplus \overline{B}$ | $\overline{A \oplus \overline{B}}$ |
| $\overline{A} \oplus \overline{B}$ | $\overline{\overline{A} \oplus \overline{B}}$ |

For the purposes of this specification, a 3-input "coincidence function" is defined as any of the sixteen Boolean functions depicted in Table 3.

TABLE 3

The 3-Input Coincidence Functions

| $A \oplus B \oplus C$ | $\overline{A} \oplus B \oplus C$ | $\overline{A \oplus B \oplus C}$ | $\overline{\overline{A} \oplus B \oplus C}$ |
|---|---|---|---|
| $A \oplus B \oplus \overline{C}$ | $\overline{A} \oplus B \oplus \overline{C}$ | $\overline{A \oplus B \oplus \overline{C}}$ | $\overline{\overline{A} \oplus B \oplus \overline{C}}$ |
| $A \oplus \overline{B} \oplus C$ | $\overline{A} \oplus \overline{B} \oplus C$ | $\overline{A \oplus \overline{B} \oplus C}$ | $\overline{\overline{A} \oplus \overline{B} \oplus C}$ |
| $A \oplus \overline{B} \oplus \overline{C}$ | $\overline{A} \oplus \overline{B} \oplus \overline{C}$ | $\overline{A \oplus \overline{B} \oplus \overline{C}}$ | $\overline{\overline{A} \oplus \overline{B} \oplus \overline{C}}$ |

In accordance with the illustrative embodiment of the present invention, unanimity gates 511-0 through 511-3 and unanimity gate 520 are each a 4-input Boolean exclusive-OR gate. After reading this specification, it will be clear to those skilled in the art how to make and use alternative embodiments of the present invention in which some or all of unanimity gates 511-0 through 511-3 and unanimity gate 520 perform other coincidence functions. For the purposes of this specification, the term "unanimity gate" is defined as logic that performs a coincidence function.

The construction of the illustrative embodiment for any value of B is as follows. Temporal delay device 501-x for x=0 through B−1, receives bit $b_x$ from the word module and timing signal $\alpha_0$. Each of unanimity gates 511-0 through 511-B is a B-input unanimity gate. The output of temporal delay device 501-x is fed into one of the inputs of unanimity gate 511-x. The output of unanimity gate 511-x is fed into the D input of temporal delay device 502-x. Temporal delay device 502-x also receives as input timing signal $\Phi_0$. Unanimity gate 511-x also receives as an input the output of unanimity gate 511-y, for y=0 to x−1 (for x>0) and the output of temporal delay device 502-f, for f=x+1 to B−1 (for f<B). The output of temporal delay device 502-0 is fed into one of the inputs of B input unanimity gate 520. The output of temporal delay devices 502-1 through 502-B is fed into the D input of temporal delay devices 503-1 through 503-B respectively. Each of temporal delay devices 503-1 through 503-B is clocked by timing signal $\Phi_0$ through $\Phi_{B-1}$. The outputs of temporal delay devices 503-1 through 503-B are fed into unanimity gate 520.

Figure 6:
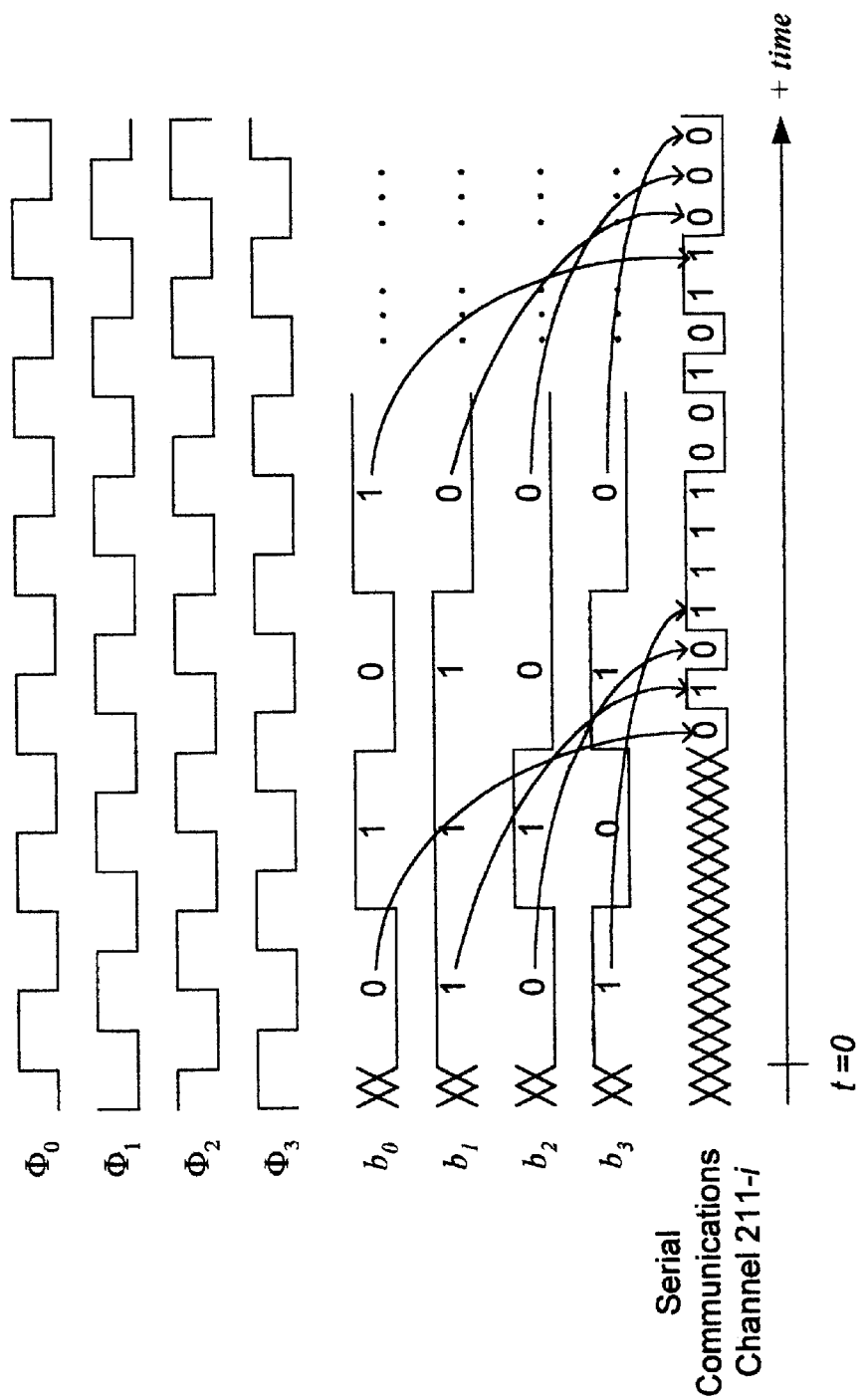
FIG. 6 depicts a timing diagram that illustrates the relationship of timing signals $\Phi_0$ through $\Phi_B$, bits $b_0$ through $b_3$, and the output on serial communications channel 211-i.

FIG. 6 depicts a timing diagram that illustrates the relationship of timing signals $\Phi_0$ through $\Phi_{B-1}$, bits $b_0$ through $b_3$, and the output on serial communications channel 211-i. Note that one full clock cycle after bits $b_0$ through $b_3$ are clocked into temporal delay devices 501-0 through 501-3, respectively, bits $b_0$ through $b_3$ appear on serial communications channel 211-i at a bit rate equal to the frequency of $\Phi_0$ multiplied by B and in little endian order.

Figure 7:
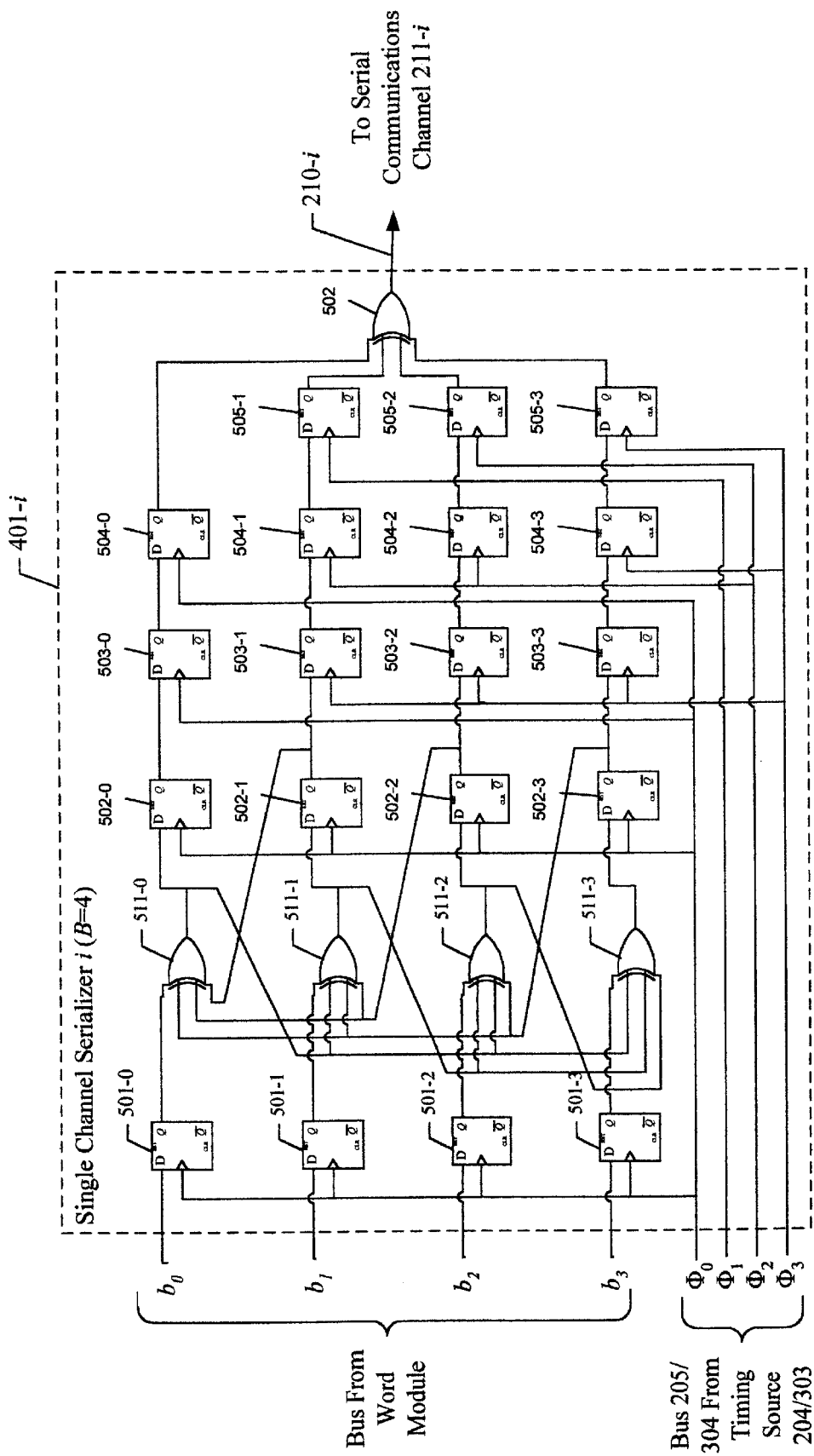
FIG. 7 depicts a block diagram of an alternative illustrative embodiment in which the set-up and hold times for the various bi-stable storage devices are more easily satisfied.

Particularly because temporal delay devices 502-1 through 502-3 are clocked with a different timing signal than temporal delay devices 503-1 through 503-3, the set-up and hold times for temporal delay devices 503-1 through 503-3 might, in some embodiments, not be easy to satisfy. To ameliorate this difficulty, FIG. 7 depicts a block diagram of an alternative illustrative embodiment in which the set-up and hold times for the various temporal delay devices are more easily satisfied. Although the embodiment depicted in FIG. 7 is shown for B=4, it will be clear to those skilled in the art how, after reading this specification, to make and use alternative embodiments of the present invention in which B equals a value other than 4.

Figure 8:
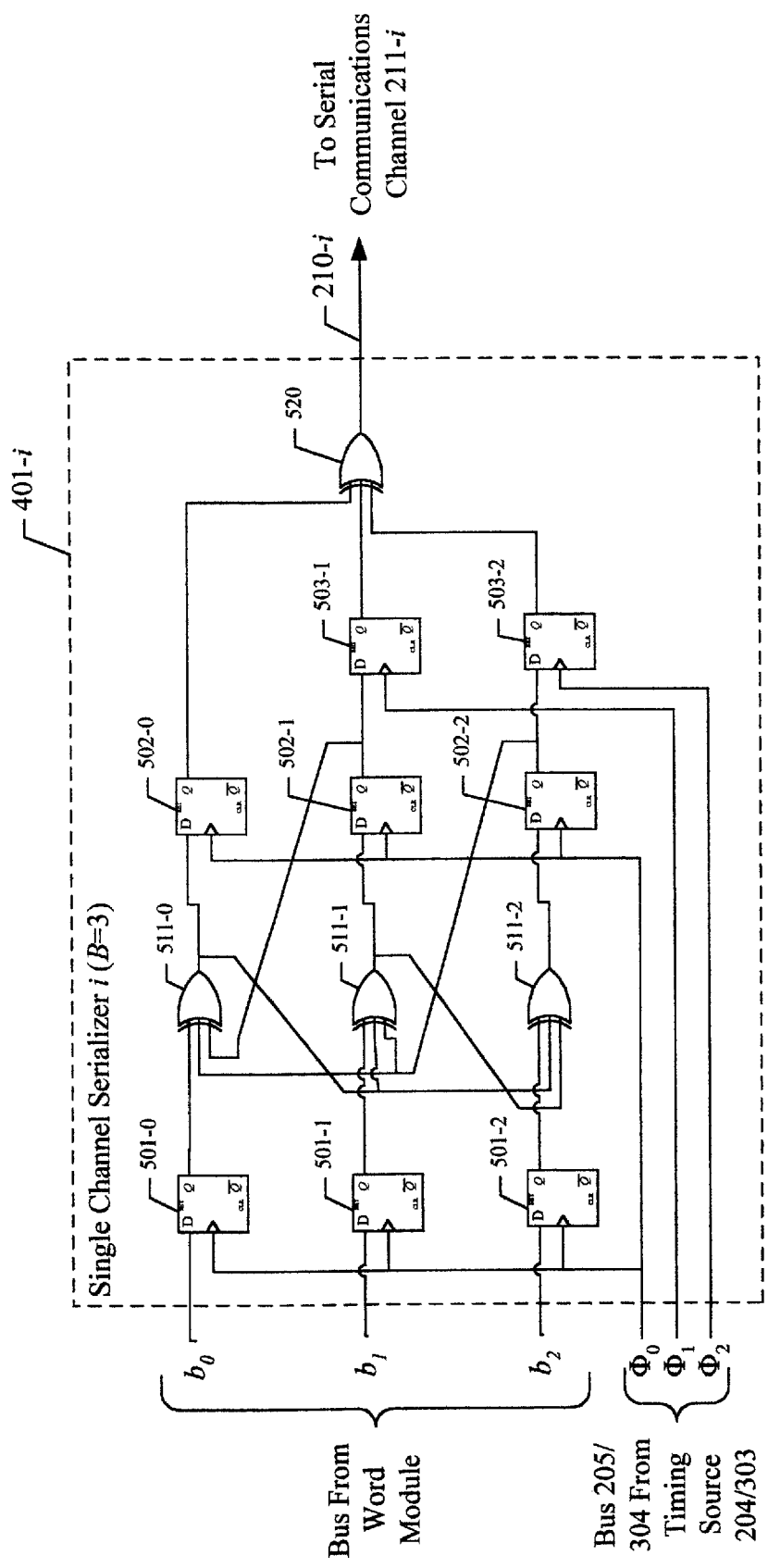
FIG. 8 depicts a block diagram of the salient components comprising an illustrative embodiment in which B=3.

FIG. 8 depicts a block diagram of the salient components comprising an illustrative embodiment of the present invention in which B=3.

Figure 9:
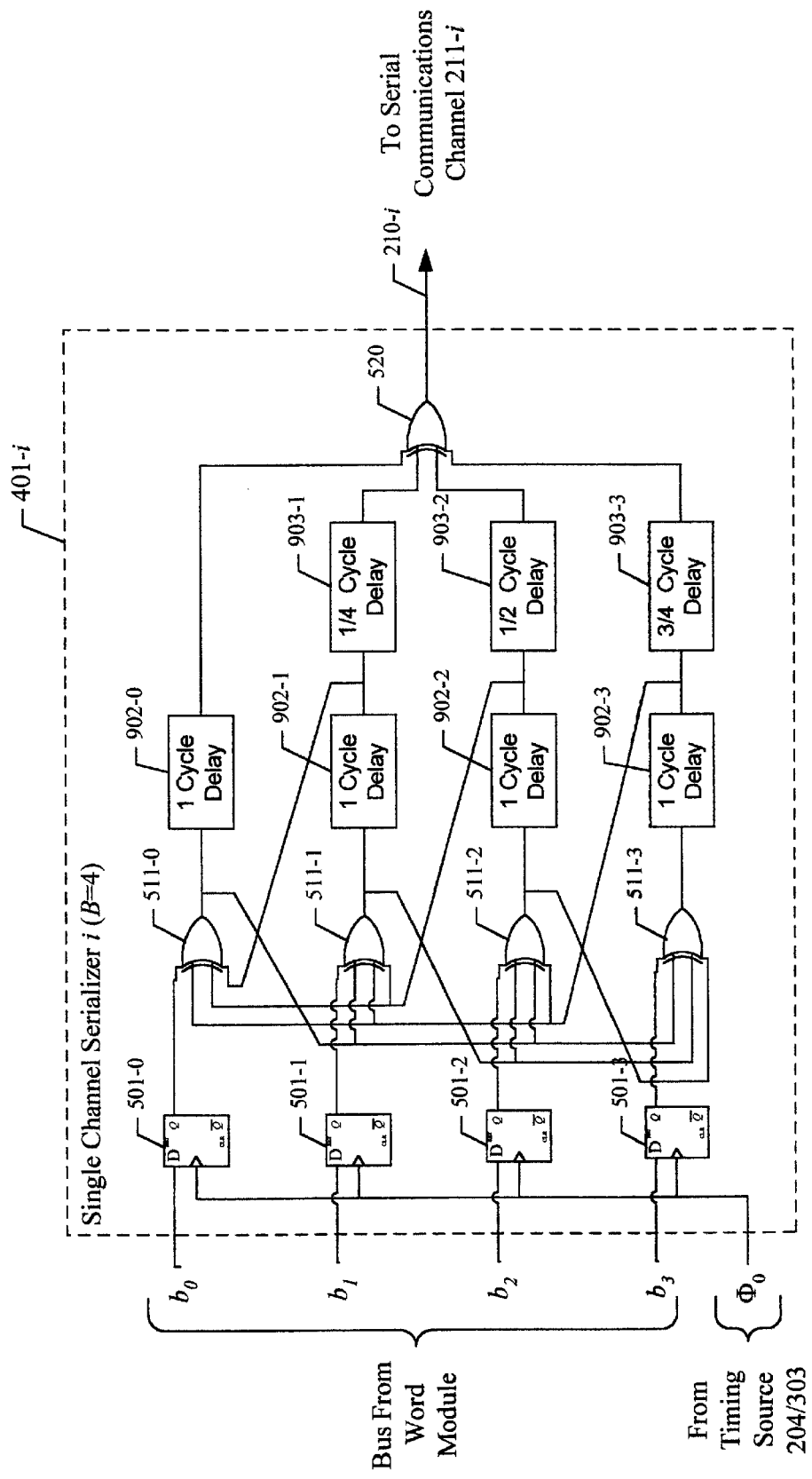
FIG. 9 depicts a block diagram of an alternative embodiment of the present invention.

FIG. 9 depicts a block diagram of an alternative embodiment of the present invention in which temporal delay devices 902-0 through 902-3 and 903-1 through 903-3 are fixed delay elements. It will be clear to those skilled in the art how to make and use fixed delay elements. The temporal delay through temporal delay devices 902-0 through 902-3 is equal to one cycle of timing signal $\Phi_0$. Temporal delay device 903-g, for g=1 through B−1, has a delay equal to $g/B$ of one cycle of timing signal $\Phi_0$. The illustrative embodiment depicted in FIG. 9 is advantageous in that multiple clock signals are not required.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. An apparatus comprising:
a fist unanimity gate for generating a first binary waveform based on a first coincidence function of a second binary waveform and a third binary waveform;
a second unanimity gate for generating a fourth binary waveform based on a second coincidence function of said first binary waveform and a fifth binary waveform; and
a fist temporal delay device for receiving said fourth binary waveform and for generating said third binary waveform based on said fourth binary waveform.

2. The apparatus of claim 1 wherein said first temporal delay device is a first bi-stable storage device.

3. The apparatus of claim 1 further comprising a second temporal delay device for generating a sixth binary waveform based on said first binary waveform.

4. The apparatus of claim 3 further comprising a third temporal delay device for receiving said third binary waveform and for generating a seventh binary waveform based on said third binary waveform.

5. The apparatus of claim 4 further comprising a third unanimity gate for generating an eighth binary waveform based on a third coincidence function of said sixth binary waveform and said seventh binary waveform.

6. The apparatus of claim 5 wherein said first coincidence functions said second coincidence function, and said third coincidence function are the same; and
wherein said first timing signal and said second timing signal are out of phase with respect to each other.

7. An apparatus comprising:
a first unanimity gate for generating a first binary waveform based on a first coincidence function of a second binary waveform, a third binary waveform, and a fourth binary waveform;
a second unanimity gate for generating a fifth binary waveform based on a second coincidence function of said first binary waveform, said third binary waveform, and a sixth binary waveform; and
a third unanimity gate for generating a seventh binary waveform based on a third coincidence function of said first binary waveform, said fifth binary waveform, and an eighth binary waveform.

8. The apparatus of claim 7 further comprising:
a first temporal delay device for receiving said fifth binary waveform and for generating said fourth binary waveform based on said fifth binary waveform; and
a second temporal delay device for receiving said seventh binary waveform and for generating said third binary waveform based on said seventh binary waveform.

9. The apparatus of claim 7 further comprising:
a first bi-stable storage device for receiving said fifth binary waveform and a first timing signal, and for generating said fourth binary waveform based on said fifth binary waveform and said first timing signal; and
a second bi-stable storage device for receiving said seventh binary waveform and said first timing signal, and for generating said third binary waveform based on said seventh binary waveform and said first timing signal.

10. The apparatus of claim 8 further comprising:
a third bi-stable storage device for receiving said fourth binary waveform and a second timing signal and for generating a ninth binary waveform based on said fourth binary waveform and said second timing signal; and
a fourth bi-stable storage device for receiving said third binary waveform and a third timing reference signal and for generating a tenth binary waveform based on said third binary waveform and said third timing reference signal.

11. The apparatus of claim 10 further comprising a fourth unanimity gate for generating an eleventh binary waveform based on a fourth coincidence function of said twelfth bin waveform, said ninth binary waveform, and said tenth binary waveform.

12. The apparatus of claim 11 wherein said first coincidence function, said second coincidence function, said third coincidence function, and said fourth coincidence function are the same; and
wherein said first timing signal, said second timing signal, and said third timing signal are out of phase with respect to each other.

13. An integrated circuit comprising:
a plurality of single-channel serializers, wherein each of said single-channel serializers comprises:
(i) a first unanimity gate for generating a first binary waveform based on a first coincidence function of a second binary waveform and a third binary waveform;

(ii) a second unanimity gate for generating a fourth binary waveform based on a second coincidence function of said first binary waveform and a fifth binary waveform; and (iii) a first temporal delay device for receiving said fourth binary waveform and for generating said third binary waveform based on said fourth binary waveform.

14. The integrated circuit of claim 13 wherein said first temporal delay device is a first bi-stable storage device.

15. The integrated circuit of claim 13 wherein each of said single-channel serializers further comprises (iv) a second temporal delay device for receiving said first binary waveform and for generating a sixth binary waveform based on said first binary waveform.

16. The integrated circuit of claim 15 wherein each of said single-channel serializers further comprises (v) a third temporal delay device for receiving said third binary waveform and for generating a seventh binary waveform based on said third binary waveform.

17. The integrated circuit of claim 16 wherein each of said single-channel serializers further comprises (vi) a third unanimity gate for generating an eighth binary waveform based on a third coincidence function of said sixth binary waveform and said seventh binary waveform.

18. The integrated circuit of claim 17 wherein said first coincidence function, said second coincidence function, and said third coincidence function are the same.

19. An integrated circuit comprising:

a plurality of single-channel serializers, wherein each of said single-channel serializers comprises:

(i) a first unanimity gate for generating a first binary waveform based on a first coincidence function of a second binary waveform, a third binary waveform, and a fourth binary waveform;

(ii) a second unanimity gate for generating a fifth binary waveform based on a second coincidence function of said first binary waveform, said third binary waveform, and a sixth binary waveform; and (iii) a third unanimity gate for generating a seventh binary waveform based on a third coincidence function of said first binary waveform, said fifth binary waveform, and an eighth binary waveform.

20. The integrated circuit of claim 19 wherein each of said single-channel serializers further comprises:

(iv) a first temporal delay device for receiving said fifth binary waveform and for generating said fourth binary waveform based on said fifth binary waveform; and (v) a second temporal delay device for receiving said seventh binary waveform and for generating said third binary waveform based on said seventh binary waveform.

21. The integrated circuit of claim 19 wherein each of said single-channel serializers further comprises:

(iv) a first bi-stable storage device for receiving said fifth binary waveform and a first timing signal and for generating said fourth binary waveform based on said fifth binary waveform and said first timing signal; and (v) a second bi-stable storage device for receiving said seventh binary waveform and said first timing signal and for generating said third binary waveform based on said seventh binary waveform and said first timing signal.

22. The integrated circuit of claim 20 wherein each of said single-channel serializers further comprises:

(vi) a third bi-stable storage device for receiving said fourth binary waveform and a second timing signal and for generating a ninth binary waveform based on said fourth binary waveform and said second timing signal; and (vii) a fourth bi-stable storage device for receiving said third binary waveform and a third timing reference signal and for generating a tenth binary waveform based on said third binary waveform and said third timing reference signal.

23. The integrated circuit of claim 22 wherein each of said single-channel serializers further comprises: (viii) a fourth unanimity gate for generating an eleventh binary waveform based on a fourth coincidence function of said first binary waveform, said ninth binary waveform, and said tenth binary waveform.

24. The integrated circuit of claim 23 wherein said first coincidence function, said second coincidence function, said third coincidence function, and said fourth coincidence function are the same; and wherein said first timing signal, said second timing signal, and said third timing signal are out of phase with respect to each other.

* * * * *